(12) United States Patent
Akaike et al.

(10) Patent No.: US 10,249,591 B2
(45) Date of Patent: Apr. 2, 2019

(54) RESIN COMPOSITION, BONDED BODY AND SEMICONDUCTOR DEVICE

(71) Applicant: MITSUBISHI MATERIALS CORPORATION, Tokyo (JP)

(72) Inventors: Hiroto Akaike, Naka (JP); Kazuhiko Yamasaki, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/766,109

(22) PCT Filed: Oct. 17, 2016

(86) PCT No.: PCT/JP2016/080704
§ 371 (c)(1),
(2) Date: Apr. 5, 2018

(87) PCT Pub. No.: WO2017/073393
PCT Pub. Date: May 4, 2017

(65) Prior Publication Data
US 2018/0286829 A1 Oct. 4, 2018

(30) Foreign Application Priority Data

Oct. 29, 2015 (JP) ................................ 2015-212947
Jul. 29, 2016 (JP) ................................ 2016-150723

(51) Int. Cl.
*H01L 23/00* (2006.01)
*C09J 9/02* (2006.01)
(Continued)

(52) U.S. Cl.
CPC ............... *H01L 24/29* (2013.01); *C08K 3/08* (2013.01); *C08K 9/04* (2013.01); *C08L 101/00* (2013.01);
(Continued)

(58) Field of Classification Search
CPC ......... H01L 21/52; H01L 24/29; H01L 24/31; C09J 163/00; C09J 9/02; C08K 3/08; C08K 9/04; C08L 101/00
(Continued)

(56) References Cited

U.S. PATENT DOCUMENTS

| 6,017,587 A | 1/2000 | Kleyer et al. |
| 7,981,228 B2 * | 7/2011 | Tomita ..................... C09J 1/00 |
| | | 106/469 |
| 2008/0160183 A1 | 7/2008 | Ide et al. |

FOREIGN PATENT DOCUMENTS

| JP | 2000-038510 A | 2/2000 |
| JP | 2008-166086 A | 7/2008 |

(Continued)

OTHER PUBLICATIONS

International Search Report dated Dec. 27, 2016, issued for PCT/JP2016/080704 and English translation hereof.

*Primary Examiner* — Luan C Thai
(74) *Attorney, Agent, or Firm* — Locke Lord LLP

(57) ABSTRACT

A resin composition is provided, including a binder resin, and silver-coated particles in which a functional group is introduced to a surface. A ratio (a/b) of Young's modulus (a) of the silver-coated particles to Young's modulus (b) of the binder resin after being cured is 0.1 to 2.0, and the Young's modulus (a) of the silver-coated particles is 0.05 to 2.0 GPa.

12 Claims, 1 Drawing Sheet

(51) Int. Cl.
*C09J 163/04* (2006.01)
*C09J 163/10* (2006.01)
*C09J 183/04* (2006.01)
*C09J 175/04* (2006.01)
*C09J 163/00* (2006.01)
*C08K 3/08* (2006.01)
*C08K 9/04* (2006.01)
*C08L 101/00* (2006.01)
*H01L 21/52* (2006.01)

(52) U.S. Cl.
CPC .............. *C09J 9/02* (2013.01); *C09J 163/00* (2013.01); *C09J 163/04* (2013.01); *C09J 163/10* (2013.01); *C09J 175/04* (2013.01); *C09J 183/04* (2013.01); *H01L 21/52* (2013.01); *H01L 24/32* (2013.01); *H01L 24/83* (2013.01); *H01L 2224/2929* (2013.01); *H01L 2224/2949* (2013.01); *H01L 2224/29291* (2013.01); *H01L 2224/29411* (2013.01); *H01L 2224/29439* (2013.01); *H01L 2224/32225* (2013.01); *H01L 2224/83851* (2013.01); *H01L 2924/3512* (2013.01)

(58) Field of Classification Search
USPC ........................................................ 257/746
See application file for complete search history.

(56) References Cited

FOREIGN PATENT DOCUMENTS

| | | | |
|---|---|---|---|
| JP | 4872220 | B2 | 2/2012 |
| JP | 5651913 | B2 | 1/2015 |

\* cited by examiner

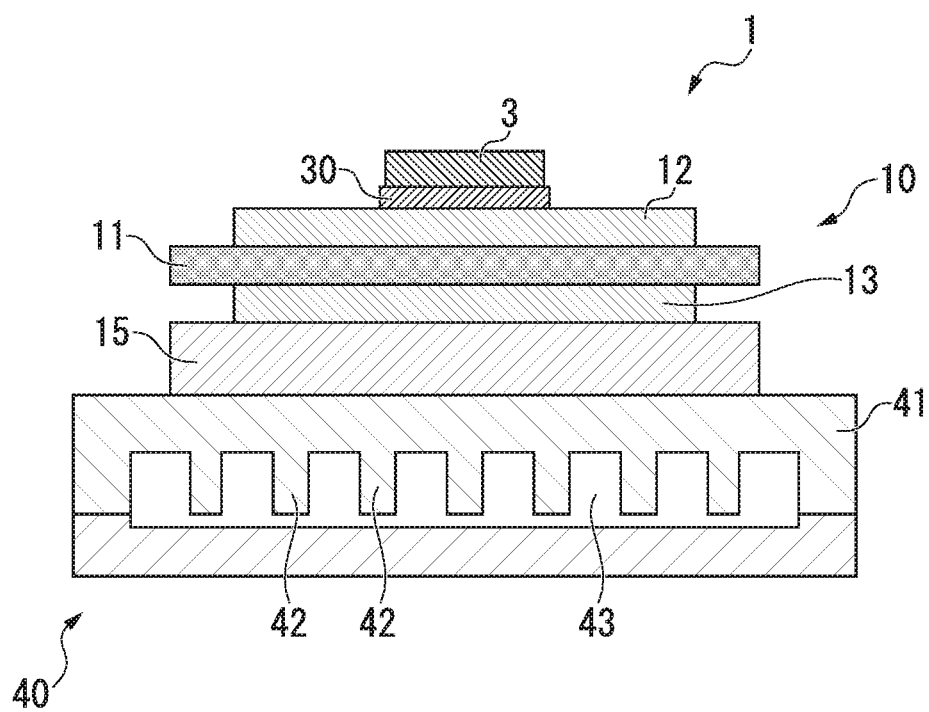

RESIN COMPOSITION, BONDED BODY AND SEMICONDUCTOR DEVICE

TECHNICAL FIELD

The present invention relates to a resin composition that can be used, for example, when mounting a semiconductor element on an insulating circuit substrate and the like, a bonded body bonded by using the resin composition and a semiconductor device.

Priority is claimed on Japanese Patent Application No. 2015-212947, filed on Oct. 29, 2015, and Japanese Patent Application No. 2016-150723, filed on Jul. 29, 2016, the contents of which are incorporated herein by reference.

BACKGROUND ART

Semiconductor devices such as an LED and a power module have a structure in which a semiconductor element is bonded onto a circuit layer formed from a conductive material.

In a power semiconductor element for a large-power control used to control wind power generation, electric vehicles, hybrid cars, and the like, the amount of power generation is great. Accordingly, as a substrate on which the power semiconductor element is mounted, for example, a power module substrate which includes a ceramic substrate formed from aluminum nitride (AlN), alumina ($Al_2O_3$), and the like, and a circuit layer formed by arranging a metal having excellent conductivity and the like on one surface of the ceramic substrate has been widely used in the related art.

As the power module substrate, a substrate in which a metal layer is formed on the other surface of the ceramic substrate is also provided.

Here, when mounting the semiconductor element on the circuit layer, for example, a resin composition such as a conductive adhesive is used in some cases. The resin composition is cured with heat and the like, and thus bonding of a member and the like can be performed by curing the resin composition after applying the resin composition to a portion to be bonded. As the resin composition, typically, a resin composition including a binder resin and conductive particles is known.

For example, PTL 1 discloses a resin composition which uses a resin in which an epoxy resin is set as a main component as the binder resin, and silver particles as the conductive particles. In PTL 1, an epoxidized butadiene-styrene copolymer is additionally added as a resin binder to mitigate stress of an adhesive layer formed by curing the resin composition.

In addition, for example, PTL 2 discloses a resin composition which includes an epoxy compound as a binder resin, and in which a nickel powder or a silver-coated powder is used as the conductive particles. In PTL 2, as a catalyst that cures the binder resin, an organic metal complex of titanium or zirconium is used to suppress deterioration of conductivity due to a heat cycle.

CITATION LIST

Patent Literature

[PTL 1] Japanese Patent (Granted) Publication No. 4872220

[PTL 2] Japanese Patent (Granted) Publication No. 5651913

DISCLOSURE OF INVENTION

Technical Problem

However, in the resin compositions disclosed in PTL 1 and PTL 2, in the adhesive layer formed by curing the resin composition, thermal stress is locally concentrated at the inside of the adhesive layer due to a difference in a coefficient of thermal expansion between respective materials. Therefore, cracking of the adhesive layer is caused due to the concentration of the thermal stress, and thus there is a problem in that durability or reliability deteriorates.

The invention has been made in consideration of the above-described circumstances, and an object thereof is to provide a resin composition capable of forming an adhesive layer in which local concentration of thermal stress is mitigated, a bonded body bonded by using the resin composition, and a semiconductor device.

Solution to Problem

To accomplish the above-described object, according to an aspect of the invention, a resin composition is provided, including: a binder resin, and silver-coated particles in which a functional group is introduced to a surface. A ratio (a/b) of Young's modulus (a) of the silver-coated particles to Young's modulus (b) of the binder resin after being cured is 0.1 to 2.0, and the Young's modulus (a) of the silver-coated particles is 0.05 to 2.0 GPa.

According to the resin composition having this configuration, since the ratio (a/b) of Young's modulus (a) of the silver-coated particles to the Young's modulus (b) of the binder resin after being cured is set to 0.1 to 2.0, there is no great difference between the Young's modulus of the binder resin and the Young's modulus of the silver-coated particles, and it is possible to suppress thermal stress from being locally concentrated. As a result, it is possible to suppress occurrence of cracks in an adhesive layer.

In addition, since the Young's modulus (a) of the silver-coated particles is set to 0.05 to 2.0 GPa, it is possible to secure rigidity of the adhesive layer and it is possible to suppress the adhesive layer from being harder than necessary.

Here, in the resin composition according to the aspect of the invention, the ratio (a/b) of the Young's modulus (a) of the silver-coated particles to the Young's modulus (b) of the binder resin after being cured may be 0.4 to 2.0, and the Young's modulus (a) of the silver-coated particles may be 0.2 to 2.0 GPa.

In this case, since ratio (a/b) of the Young's modulus (a) of the silver-coated particles to the Young's modulus (b) of the binder resin after being cured is set to 0.4 to 2.0, it is possible to further suppress the thermal stress from being locally concentrated. As a result, it is possible to reliably suppress occurrence of cracks in an adhesive layer. In addition, since the Young's modulus (a) of the silver-coated particles is set to 0.05 to 2.0 GPa, it is possible to further secure rigidity of the adhesive layer and it is possible to reliably suppress the adhesive layer from being harder than necessary.

In addition, in the resin composition according to the aspect of the invention, the functional group may be selected from the group consisting of an epoxy group, a carboxyl group, a carbonyl group, an amino group, an amide group, an imino group, an imidazole group, and a mercapto group.

In this case, the functional group introduced to the surface of the silver-coated particles has excellent affinity with the binder resin, and thus it is possible to enhance adhesiveness between the binder resin and the silver-coated particles.

According to another aspect of the invention, a bonded body is provided, including a first member and a second member bonded to each other. The above-described resin composition is interposed between the first member and the second member.

According to the bonded body having this configuration, since the above-described resin composition is interposed between the first member and the second member, even in a case where a heat cycle is applied to the bonded body, occurrence of cracks in the resin composition is suppressed, and thus bonding reliability between the first member and the second member is excellent.

According to still another aspect of the invention, a semiconductor device is provided, including an insulating circuit substrate in which a circuit layer is disposed on one surface of an insulating layer, and a semiconductor element bonded to a surface of the circuit layer, said surface being opposite the insulating layer. The above-described resin composition is interposed between the circuit layer and the semiconductor element.

According to the semiconductor device having this configuration, since the above-described resin composition is interposed between the circuit layer and the semiconductor element, even in a case where a heat cycle is applied to the semiconductor device, occurrence of cracks in the resin composition is suppressed, and thus bonding reliability between the circuit layer and the semiconductor element is excellent.

Advantageous Effects of Invention

According to the invention, it is possible to provide a resin composition capable of forming an adhesive layer in which local concentration of thermal stress is mitigated, a bonded body bonded by using the resin composition, and a semiconductor device.

BRIEF DESCRIPTION OF DRAWING

FIG. 1 is a schematic view illustrating a power module (semiconductor device) that uses a resin composition according to an embodiment.

BEST MODE FOR CARRYING OUT THE INVENTION

Hereinafter, detailed description will be given of a resin composition according to an embodiment of the invention, and a semiconductor device (power module) using the resin composition. Furthermore, the drawing in the following description illustrates a characteristic portion in an enlarged manner for convenience for easy understanding of characteristics, and dimensional ratios of respective constituent elements and the like are not intended to limit actual dimensional ratios and the like.

<Resin Composition>

First, description will be given of a configuration of the resin composition according to an embodiment of the invention. Schematically, the resin composition according to this embodiment includes a binder resin, and silver-coated particles.

The resin composition according to this embodiment is cured when being heated, thereby forming an adhesive layer. When the adhesive layer is formed at a portion to be bonded, a first member and a second member are bonded to each other to constitute a bonded body. The resin composition according to this embodiment may include a diluent (solvent). In a resin composition that includes the diluent, flowability is improved, and thus it is easy to apply the resin composition to an adhesive layer-forming portion in the first member, the second member, or the like.

The binder resin is cured through cross-linking or volatilization of the diluent, thereby forming the adhesive layer. The binder resin is not particularly limited as long as the binder resin is a resin capable of forming the adhesive layer through curing. Specific examples of the binder resin include an epoxy resin, a phenolic resin, a urethane resin, a silicone resin, an acrylic resin, a polyimide resin, modified resins thereof, and the like. As the binder resin, the above-described resins may be used alone or in combination of two or more kinds thereof. In addition, the binder resin may include a thermoplastic resin.

<Binder Resin in Resin Composition>

Examples of the epoxy resin as the binder resin included in the resin composition include a bisphenol type epoxy resin, a biphenyl type epoxy resin, a biphenyl mixed type epoxy resin, a naphthalene type epoxy resin, a cresol novolac type epoxy resin, a dicyclopentadiene type epoxy resin, a trisphenol ethane type epoxy resin, and a tetraphenol ethane type epoxy resin.

As a curing agent of the epoxy resin, typically used latent curing agents such as imidazoles, tertiary amines, Lewis acid including boron fluoride, compounds thereof, a phenol-based curing agent, an acid anhydride-based curing agent, and dicyandiamide are preferable. Examples of the imidazoles include 2-methyl imidazole, 2-ethyl-4-methyl imidazole, 2-phenyl imidazole, 2-phenyl-4-methyl imidazole, 2-phenyl-4,5-dihydroxymethyl imidazole, 2-phenyl-4-methyl-5-hydroxymethyl imidazole, 2-phenylimidazole isocyanuric acid adduct, and the like. Examples of the tertiary amines include piperidine, benzyl diamine, diethylaminopropyl amine, isophorone diamine, diaminodiphenyl methane, and the like. Examples of the Lewis acid including boron fluoride include an amine complex of boron fluoride such as boron fluoride monoethyl amine. Examples of the phenol-based curing agent include a phenol novolac resin, a paraxylylene phenol resin, a dicyclopentadiene phenol resin, and the like. Examples of the acid anhydride-based curing agent include phthalic anhydride, tetrahydrophthalic anhydride, hexahydrophthalic anhydride, and the like.

In addition, a curing accelerator may be added to the epoxy resin as necessary. Examples of the curing accelerator include imidazoles such as 1-benzyl-2-methylimidazole and salts thereof, tertiary amine such as 1,8-diazabicyclo [5.4.0] undece-7-ene and salts thereof, organophosphine compounds such as triphenylphosphine and salts thereof, organic metal salts such as zinc octylate, tin octylate, and alkoxy titanium, noble metals such as platinum and palladium, and the like.

The phenol resin as the binder resin included in the resin composition may have any structure as long as the phenol resin is a thermosetting type, but a molar ratio of formaldehyide/phenol is preferably in a range of 1 to 2. A weight-average molecular weight of the thermosetting type phenol resin is preferably 300 to 5000, and more preferably 1000 to 4000.

As the urethane resin as the binder resin included in the resin composition, a urethane resin typically used for adhesion may be used. Specific examples of the urethane resin include a polyol-based urethane resin, a polyester-based urethane resin, a polycaprolactam-based urethane resin, a polyether-based urethane resin, a polycarbonate-based urethane resin, a urethane acrylate resin, and the like, and these can be used alone or in combination. In addition, a curing agent such as isocyanate and blocked isocyanate may be added as necessary.

As the silicone resin as the binder resin included in the resin composition, a silicone resin having any structure between an addition type and a condensing type can be used as long as the silicone resin is typically used for adhesion.

Specific examples of the silicone resin include various organopolysiloxanes, modified polysiloxanes, elastomer-modified polysiloxanes, room temperature-curable silicone rubber, and the like, and these can be used alone or in combination.

As the acrylic resin as the binder resin included in the resin composition, a typically used thermosetting-type acrylic resin, photo-polymerization-type acrylic resin, and solvent evaporation-type acrylic resin can be used. For example, an acrylic-melamine resin, a polymethyl methacrylate resin, an acrylic-styrene copolymer, a silicone-modified acrylic resin, an epoxy-modified acrylic resin, and the like, and these may be used alone or in combination. In addition, a thermal curing agent such as isocyanate, an alkylphenone-based photopolymerization initiator, and the like can be used as the curing agent as necessary.

As the polyimide resin as the binder resin included in the resin composition, a typically used polyimide resin can be used. Examples of the polyimide resin include aromatic polyimide, alicyclic polyimide, polyimide siloxane, epoxy modified polyimide, photosensitive polyimide, and the like, and these may be used alone or in combination.

The above-described epoxy resins, the phenol resins, the urethane resins, the acrylic resins, the silicone resins, and the polyimide resins can improve the durability of formed electrodes and the like when considering that the resins can suppress quality deterioration due to a variation with the passage of time in the resin composition, and have a strong skeleton in a main chain, and thus a cured material is excellent in heat resistance or humidity resistance. It is preferable that a ratio of the binder resin in the resin composition be in a range of 25 to 75 volume % in terms of a volume ratio in a cured material. In a case where the ratio of the binder resin is less than the lower limit, a problem such as adhesiveness failure occurs. In a case where the ratio is greater than the upper limit, a defect such as a decrease in conductivity occurs.

<Diluent in Resin Composition>

Examples of the diluent include ether alcohol-based solvents such as ethylene glycol monoethyl ether, ethylene glycol monobutyl ether, propylene glycol monomethyl ether, propylene glycol monoethyl ether, propylene glycol mono-n-butyl ether, diethylene glycol monoethyl ether, diethylene glycol monobutyl ether, dipropylene glycol monomethyl ether, dipropylene glycol mono butyl ether, and tripropylene glycol monomethyl ether, acetic acid ester-based solvents thereof, aromatic hydrocarbon-based solvents such as ethylene glycol, propylene glycol, terpineol, mineral spirit, and toluene, aliphatic hydrocarbon-based solvents such as dodecane, dimethylformamide, N-methyl2-pyrrolidone, dimethylsulfoxide, diacetone alcohol, dimethyl acetamide, γ-butyrolactone, water, a reactive diluent, and the like.

The diluents are selected in accordance with compatibility with the binder resin. In the silicone resin, mineral sprit or toluene is preferable. In the polyimide resin, N-methyl-2-pyrrolidone, phenol resin, and urethane resin are preferable. In the epoxy resin, ethyl carbitol acetate, butyl carbitol acetate, and α-terpineol are preferable. The solvents can be used alone or in combination of a plurality of species.

An additive may be mixed in the binder resin and a mixture thereof in a range not deteriorating conductivity, thermal conductivity, adhesiveness, and shape-retaining properties. Examples of the additive include a silane coupling agent, a titanium coupling agent, silver nanoparticles, a thickener, a dispersant, a flame retardant, an antifoaming agent, an antioxidant, and the like.

Young's modulus of the binder resin after being cured is preferably 0.1 to 5.0 GPa, and more preferably 0.5 to 2.0 GPa. In a case where the Young's modulus of the binder resin is 0.1 GPa or greater, when an external force is applied to a bonded body, deformation of the bonded body is suppressed. In addition, in a case where the Young's modulus of the binder resin is 5.0 GPa or less, it is possible to mitigate thermal stress when a temperature varies.

Furthermore, for example, the Young's modulus of the binder resin after being cured can be measured by the following method. First, a solvent that includes the binder resin is applied onto a substrate by using a roll coater, a bar coater, and the like, and the binder resin is cured through heating, thereby forming a binder resin film (adhesive layer) on the substrate. Next, the Young's modulus can be measured by using a microindentation hardness tester (for example, "ENT-1100" manufactured by ELIONIX INC.) with respect to the film that is formed.

The silver-coated particles apply conductivity and thermal conductivity to the resin composition. The silver-coated particles include nucleus particles (parent particles), a tin-adsorbed layer provided on a surface of the particles, a silver-coated layer coated on a surface of the tin-adsorbed layer, and a functional group introduced to a surface of the silver-coated layer.

A shape of the particles is selected in accordance with desired rheological properties of the resin composition. With regard to the shape of the particles, examples of the particles include completely spherical particles, particles having a shape such as an ellipse close to the spherical shape, particles in which slight unevenness exists on a surface, flat particles, squamous particles, rod-shaped particles, and the like.

The particles are not particularly limited, and specific examples thereof include acrylic resin particles, styrene resin particles, phenol resin particles, silicone resin particles, silicone rubber particles, polyimide resin particles, fluorine rubber particles, and the like.

An average particle size of the resin particles is preferably 0.5 to 40 μm. A particle size distribution in the particle size of the resin particles is different in accordance with desired rheological properties of a silver-coated particle-containing resin composition, and it is preferable that the particle size distribution be broad in a constant range in order to apply thixotropic properties to the silver-coated particle-containing resin composition.

When the average particle size of the resin particles is set to 0.5 μm or greater, a surface area of the resin particles decreases. Accordingly, it is possible to reduce the amount of silver for obtaining conductivity and thermal conductivity necessary for a conductive and thermal conductive filler. In addition, when the average particle size of the resin particles is set to 40 μm or less, it is easy to apply the silver-coated particle-containing resin composition to various applications and printing methods.

Here, the average particle size is measured by the following method. First, the diameter of 300 resin particles is measured at a magnification of 2000 to 5000 times with software (product name: PC SEM, and the like) by using a scanning electron microscope (for example, "SU-1500", manufactured by Hitachi High-Technologies Corporation). Next, an average value of the diameter of the resin particles is calculated from obtained measured values to obtain the average particle size.

The tin-adsorbed layer is provided on the surface of the resin particles. The tin-adsorbed layer contains divalent ions of tin. When the tin-adsorbed layer is provide on the surface of the resin particles, it is possible to coat the surface of the tin-adsorbed layer with silver by using an electroless plating method.

The coating amount of silver (the amount of silver contained) is determined in accordance with the average particle size of the resin particles, and desired conductivity. As the coating amount of silver, specifically, the amount of silver contained is preferably 2 to 88 parts by mass with respect to 100 parts by mass of silver-coated particles, and more preferably 2 to 80 parts by mass.

In a case where the amount of silver contained is set to 2 parts by mass or greater with respect to 100 parts by mass of silver-coated particles, when the silver-coated particles are dispersed as a conductive filler, it is easy to obtain a contact point between silver particles, and it is possible to apply sufficient conductivity. On the other hand, when the amount of silver contained is set to 88 parts by mass or less, the specific gravity is relatively small, and thus it is possible to suppress an increase in the cost.

With regard to the conductivity of the silver-coated particles, powder volume resistance is preferably $1 \times 10^{-2}$ $\Omega \cdot cm$ or less, and more preferably $3 \times 10^{-3}$ $\Omega \cdot cm$ or less.

When the powder volume resistance is set to $1 \times 10^{-2}$ $\Omega \cdot cm$ or less, a resistance value is lowered, and thus the silver-coated particles are suitable as a conductive material and a thermal conductive material.

Furthermore, the powder volume resistance is a value measured as follows. That is, a sample powder (silver-coated particles) is put into a pressure container and is compressed at 9.8 MPa to obtain a green compact. Then, a resistance value of the green compact is measured as the power volume resistance by a digital multi-meter.

Here, when one silver-coated particle is compressed in one direction by 20% of the particle size, a resistance value in the compression direction is preferably 100Ω or less. In addition, when one silver-coated particle is compressed in one direction by 50% of the particle size, the resistance value in the compression direction is preferably 10Ω or less.

The functional group is introduced onto the surface of the silver-coated layer by using a surface-treating agent (coating agent). As the functional group introduced onto the surface of the silver-coated layer, a functional group having high affinity with the binder resin is preferable. Specific example of the functional group include an epoxy group, a carboxyl group, a carbonyl group, an amino group, an amide group, an imino group, an imidazole group, a mercapto group, and the like.

When the functional group is introduced, the affinity between the binder resin and the silver-coated particles is enhanced, and thus adhesiveness between the binder resin and the silver-coated particles is enhanced. As a result, it is possible to form an adhesive layer in which local concentration of thermal stress is mitigated.

The Young's modulus of the silver-coated particles is preferably 0.05 to 2.0 GPa, more preferably 0.2 to 2.0 GPa, and particularly more preferably 0.5 to 1.5 GPa. In a case where the Young's modulus of the silver-coated particles is 0.05 GPa or greater, when kneading the resin composition, deformation of the silver-coated particles is suppressed, and thus an internal residual stress decreases. As a result, occurrence of voids or cracks is suppressed. In addition, in a case where the Young's modulus of the silver-coated particles is 2.0 GPa or less, the Young's modulus of a resin composition coated film is maintained to a constant value or less, and thus thermal stress when a temperature varies decreases.

Furthermore, the Young's modulus of the silver-coated particles can be measured, for example, by using a micro-compression tester (for example, "MCT-2000" manufactured by Shimadzu Corporation).

In the resin composition according to this embodiment, a ratio (a/b) of the Young's modulus (a) of the silver-coated particles to the Young's modulus (b) of the binder resin after being cured is preferably 0.4 to 2.0, and more preferably 0.6 to 1.5.

When the ratio (a/b) of the Young's modulus is set to the range of 0.4 to 2.0, it is possible to form an adhesive layer in which local concentration of thermal stress is mitigated. Accordingly, the adhesive layer formed by the resin composition according to this embodiment is excellent in heat cycle resistance.

Next, a method of manufacturing the resin composition will be described in detail.

First, resin particles are added to an aqueous solution of a tin compound and the resultant mixture is stirred to prepare silver-coated particles. Then, the resin particles are filtrated and are washed with water. Accordingly, the tin-adsorbed layer is provided on the surface of the resin particles.

Here, as the tin compound, stannous chloride, stannous fluoride, stannous bromide, stannous iodide, and the like can be used. In a case of using stannous chloride, the amount of stannous chloride contained in the aqueous solution of the tin compound is preferably 30 to 100 $g/dm^3$. When the amount of stannous chloride contained is 30 $g/dm^3$ or greater, it is easy to form a uniform tin-adsorbed layer. In addition, when the amount of stannous chloride contained is 100 $g/dm^3$ or less, it is easy to suppress the amount of unavoidable impurities in the stannous chloride. Furthermore, stannous chloride can be contained in the aqueous solution of the tin compound until being saturated.

In addition, it is preferable that the aqueous solution of the tin compound contain 0.5 to 2 $cm^3$ of hydrochloric acid with respect to 1 g of stannous chloride. When the amount of hydrochloric acid is 0.5 $cm^3$ or greater, dissolubility of the stannous fluoride is improved, and it is possible to suppress hydrolysis of tin. When the amount of hydrochloric acid is 2 $cm^3$ or less, pH of the aqueous solution of the tin compound is not lowered so much, and thus it is possible to allow tin to adhere to the resin particles with efficiency.

In addition, a temperature of the aqueous solution of the tin compound may be 20° C. to 45° C. The temperature is preferably 20° C. to 35° C., more preferably 25° C. to 35° C., and still more preferably 27° C. to 35° C.

When the temperature of the aqueous solution of the tin compound is set to 20° C. or higher, activity of the aqueous solution is suppressed from being lowered, and thus it is possible to allow the tin compound to sufficiently adhere to the resin particles. On the other hand, when the temperature of the aqueous solution of the tin compound is set to 45° C. or lower, it is possible to suppress oxidization of the tin compound, and the aqueous solution is stabilized. As a result, it is possible to allow the tin compound to sufficiently adhere to the resin particles. When the tin compound is adsorbed to the resin particles in the aqueous solution kept at 20° C. to 45° C., even in fine particles composed of an acrylic resin or a styrene resin of which adhesiveness is not satisfactory, it is possible to allow silver crystal particles having an appropriate crystallite diameter to precipitate.

Accordingly, it is possible to form a silver-coated layer excellent in adhesiveness and compactness. In addition, since the silver-coated layer is excellent in adhesiveness and compactness, it is possible to reduce a resistance value in compression in one compression direction by 10% of a particle size.

In addition, stirring time is appropriately determined in accordance with the temperature of the aqueous solution of the tin compound and the amount of the tin compound contained, and the stirring time is preferably 0.5 to 24 hours.

Next, the silver-coated layer is formed by coating the surface of the tin-adsorbed layer with silver by using an electroless coating method. Accordingly, the silver-coated particles are obtained. Examples of the electroless coating method include (1) a method in which resin particles provided with the tin-adsorbed layer are immersed in an aqueous solution including a complexing agent, a reducing agent, and the like, and an aqueous silver salt solution is added dropwise to the resultant aqueous solution, (2) a method in which the resin particles provided with the tin-adsorbed layer are immersed in an aqueous solution including a silver salt and a complexing agent, and an aqueous reducing agent solution is added dropwise to the resultant aqueous solution, and (3) a method in which the resin particles provided with the tin-adsorbed layer are immersed in an aqueous solution that includes a silver salt, a complexing agent, a reducing agent, and the like, and a caustic alkali aqueous solution is added dropwise to the resultant aqueous solution.

Here, as the silver salt, silver nitrate, a salt obtained by dissolving silver in nitric acid, and the like can be used. As the complexing agent, salts such as ammonia, ethylenediaminetetraacetic acid, tetrasodium ethylenediaminetetraacetate, nitro triacetic acid, triethylenetetraammine hexacetic acid, sodium thiosulfate, succinate, iminosuccinic acid, citrate and an iodide salt can be used. As the reducing agent, formalin, glucose, imidazole, a rochelle salt (potassium sodium tartrate), hydrazine and derivatives thereof, hydroquinone, L-ascorbic acid, formic acid, and the like can be used. As the reducing agent, formaldehyde is preferable, and a mixture of two or more kinds of reducing agents including at least formaldehyde is more preferable, and a mixture of reducing agents including formaldehyde and glucose is still more preferable.

Next, the surface of the silver-coated particles is washed with an alkali washing solution, and vacuum drying is performed. Then, a surface-treating agent is added to the dried silver-coated particles, and the resultant mixture is kneaded, thereby introducing the functional group to the surface of the silver-coated particles.

Furthermore, as the surface-treating agent, for example, in a case of introducing an epoxy group to the surface of the silver-coated particles, an epoxy group-containing silane coupling agent, carboxy group-containing glycidyl ether, amino group-containing glycidyl ether, and the like can be used. In addition, for example, in a case of introducing a carboxyl group, a carboxyl group-containing silane coupling agent, fats such as hardened castor oil, fatty acid such as propionic acid, lauric acid, hydroxylauric acid, myristic acid, hydroxymyristic acid, palmitic acid, hydroxypalmitic acid, stearic acid, hydroxystearic acid, acrylic acid, oleic acid, and linoleic acid, hydrofatty acid, salts thereof, and solutions containing the acids can be used. In addition, for example, in a case of introducing a carbonyl group, the above-described surface-treating agents for introduction of the carboxyl group, urea, fatty acid esters, aromatic esters, low molecular weight urethane, and the like can be used. In addition, for example, in a case of introducing an amino group, an amino group-containing silane coupling agent, aliphatic amine such as hexylamine, diamines such as hexamethylenediamine can be used. In a case of introducing an amide group, an amide group-containing silane coupling agent, acrylamide, peptides, and fatty acid amides such as N,N-dimethylformamide and acetamide can be used. In addition, in a case of introducing an imino group, an imino group-containing silane coupling agent, guanidine, amidines, polyethyleneimine, and the like can be used. In a case of introducing an imidazole group, imidazole, alkyl imidazole such as methyl imidazole, phenyl imidazole, halogenated imidazole, imidazole carboxylic acid, hydroxymethyl imidazole, imidazolium salt, and various imidazole derivatives and salts thereof can be used. In a case of introducing a mercapto group, a mercapto group-containing silane coupling agent, alkanethiols such as dodecane thiol, alkyl disulfide compounds such as octadecyl disulfide, thioglycolic acid or salts thereof, thioacetic acid and salts thereof, and the like can be used.

Next, a binder resin, a thermal curing agent, and a curing accelerator are added to a solvent, and the resultant mixture is stirred to prepare a binder mixed solution. With regard to the curing agent and the curing accelerator, in a case of a binder resin of which blending is completed or which can be used only after solvent drying, mixing is not necessary. Here, as the solvent, ether alcohol-based solvents such as ethylene glycol monoethyl ether, ethylene glycol monobutyl ether, propylene glycol monomethyl ether, propylene glycol monoethyl ether, propylene glycol mono-n-butyl ether, diethylene glycol monoethyl ether, diethylene glycol monobutyl ether, dipropylene glycol monomethyl ether, dipropylene glycol mono butyl ether, and tripropylene glycol monomethyl ether, acetic acid ester-based solvents thereof, ethylene glycol, propylene glycol, terpineol, mineral spirit, aromatic hydrocarbon-based solvents, aliphatic hydrocarbon-based solvents, and the like can be used. The kind of solvents is determined in accordance with compatibility with a resin, and the solvents can be used alone or in combination of a plurality of species.

Next, the silver-coated particles prepared by the previous process and in which the functional group is introduced on a surface thereof, and the binder mixed solution are kneaded by a planetary stirrer, a three-roll mill, and the like, thereby preparing the resin composition according to this embodiment.

<Semiconductor Device (Power Module)>

Next, description will be given of a power module as an example of a semiconductor device using the resin composition according to this embodiment with reference to FIG. 1.

A power module 1 includes a power module substrate 10 on which a circuit layer 12 is disposed, a semiconductor element 3 bonded to a surface of the circuit layer 12 through a conductive bonding layer 30 (adhesive layer), and a cooler 40.

The power module substrate 10 includes a ceramic substrate 11 that constitutes an insulating layer, the circuit layer 12 disposed on one surface (upper surface in FIG. 1) of the ceramic substrate 11, and a metal layer 13 disposed on the other surface (lower surface in FIG. 1) of the ceramic substrate 11.

The ceramic substrate 11 is provided to prevent electrical connection between the circuit layer 12 and the metal layer 13 and is constituted by aluminum nitride (AlN) with high insulating properties. In addition, the thickness of the ceramic substrate 11 is set in a range of 0.2 to 1.5 mm, and is set to 0.635 mm in this embodiment.

The circuit layer 12 is formed by bonding a conductive metal plate to one surface of the ceramic substrate 11. In this embodiment, the circuit layer 12 is formed by bonding an aluminum plate constituted by a rolled plate of aluminum (so-called 4N aluminum) having purity of 99.99 mass % or more to the ceramic substrate 11.

The metal plate 13 is formed by bonding a metal plate to the other surface of the ceramic substrate 11. In this embodiment, as in the circuit layer 12, the metal layer 13 is formed by bonding an aluminum plate constituted by a rolled plate of aluminum (so-called 4N aluminum) having purity of 99.99 mass % or more to the ceramic substrate 11.

The cooler 40 is provided to cool down the power module substrate 10, and includes a top plate portion 41 bonded to the power module substrate 10, radiation pins 42 vertically provided from the top plate portion 41 toward a lower side, and a flow passage 43 through which a cooling medium (for example, cooling water) circulates. The cooler 40 (top plate portion 41) is preferably constituted by a material with satisfactory thermal conductivity, and is constituted by A6063 (aluminum alloy) in this embodiment.

In addition, in this embodiment, a buffer layer 15 formed from aluminum, an aluminum alloy, or a composite material (for example, AlSiC and the like) including aluminum is provided between the top plate portion 41 of the cooler 40 and the metal layer 13.

In addition, in the power module 1 illustrated in FIG. 1, the conductive bonding layer 30 (adhesive layer) is formed between the circuit layer 12 and the semiconductor element 3 by using the resin composition according to this embodiment.

The resin composition according to this embodiment is applied to a surface of the circuit layer 12 by using a dispenser or screen-printing machine at a thickness of 10 to 100 μm, and then the semiconductor element 3 is stacked on the resin composition. The resultant stacked body is cured under conditions of a temperature of 100° C. to 200° C. and retention time of 0.5 to 2.0 hours. Accordingly, the conductive bonding layer 30 is formed, and the circuit layer 12 and the semiconductor element 3 are bonded to each other.

According to the resin composition of this embodiment which has the above-described configuration, the ratio (a/b) of the Young's modulus (a) of the silver-coated particles to the Young's modulus (b) of the binder resin after being cured is 0.1 to 2.0, and the Young's modulus (a) of the silver-coated particles is 0.05 to 2.0 GPa. Accordingly, it is possible to form the conductive bonding layer 30 (adhesive layer) in which local concentration of thermal stress is mitigated.

In addition, according to the resin composition of this embodiment, an epoxy group, a carboxyl group, a carbonyl group, an amino group, an amide group, an imino group, an imidazole group, or a mercapto group is introduced to the surface of the silver-coated particles, and thus affinity between the binder resin and the silver-coated particles is high. Accordingly, adhesiveness between the binder resin and the silver-coated particles is enhanced. As a result, it is possible to form the conductive bonding layer 30 (adhesive layer) in which local concentration of thermal stress is mitigated.

According to the power module 1 according to this embodiment, the conductive bonding layer 30 is formed by using the resin composition according to this embodiment to bond the circuit layer 12 and the semiconductor element 3 to each other. Accordingly, even in a case where a heat cycle is applied to the power module 1, occurrence of cracks in the conductive bonding layer 30 is suppressed, and thus bonding reliability between the semiconductor element 3 and the power module substrate 10 is excellent.

Hereinbefore, the embodiment of the invention has been described in detail, but specific configurations are not limited to this embodiment, and include designs and the like in a range not departing from the gist of the invention.

For example, an object to be bonded is not limited to the semiconductor element, and the bonded body may be constructed by bonding an arbitrary first member and an arbitrary second member by using the above-described resin composition.

In addition, in this embodiment, description has been given of the power module as an example of the semiconductor device, but the semiconductor device may be other semiconductor devices such as an LED without limitation to the power module.

In addition, description has been given of a configuration in which the circuit layer is constituted by aluminum. However, there is no limitation thereto, and the circuit layer may be constituted by other conductive materials such as copper.

In addition, description has been given of the ceramic substrate formed from AlN as an example of the insulating layer. However, the insulating layer is not limited thereto, and may be constituted by other insulating materials such as $Al_2O_3$, $Si_3N_4$, and an insulating resin.

EXAMPLES

Hereinafter, effects of the invention will be described in detail with reference to examples and comparative examples, but the invention is not limited to the following examples.

<Preparation of Resin Composition>

Example 1

First, so as to prepare the silver-coated particles, 15 g of stannous chloride and 15 $cm^3$ of 35% hydrochloric acid were diluted (diluted in measuring cylinder) to 1 $dm^3$ with water by using a measuring flask having a capacity of 1 $dm^3$, and the resultant aqueous solution was kept at a temperature of 25° C. 25 g of acrylic resin particles (parent particles) having an average particle size of 10 μm was added to the aqueous solution, and the resultant mixture was stirred for one hour. Then, the resin particles were filtrated and were washed with water. Accordingly, a tin-adsorbed layer was provided on the surface of the resin particles.

Next, 220.0 g of tetrasodium ethylenediaminetetraacetate (complexing agent), 50 g of sodium hydroxide, and 100 $cm^3$ of formalin (reducing agent) were dissolved in 20 $dm^3$ of water to prepare an aqueous solution including the complexing agent and the reducing agent. In addition, 40 g of silver nitrate, 42 $cm^3$ of 25% ammonia water, and 200 $cm^3$ of water were mixed with each other to prepare an aqueous solution including silver nitrate.

Next, the resin particles provided with the tin-adsorbed layer were immersed in the aqueous solution including the complexing agent and the reducing agent.

Then, the aqueous solution including silver nitrate was added dropwise to the above-described aqueous solution while stirring the aqueous solution to coat the resin particles, provided with the tin-adsorbed layer, with silver so that a ratio of silver in the silver-coated particles obtained became 50 mass %, thereby preparing the silver-coated particles. Then, the silver-coated particles were washed with water, and were dried. An average particle size was measured with respect to the dried silver-coated particles. Results thereof are illustrated in Table 1. Furthermore, the average particle size of the silver-coated particles was measured by the same method as the method of measuring the average particle size of the resin particles.

Next, 40 g of the obtained silver-coated particles was subjected to surface washing with an alkali washing solution, and then vacuum drying was performed. Then, the dried silver-coated particles were added to 1 dm$^3$ of ethanol and were dispersed with ultrasonic waves, and 10 g of a surface-treating agent illustrated in Table 1 was further added to the ethanol and the resultant mixture was stirred. Accordingly, a functional group illustrated in Table 1 was introduced to the surface of the silver-coated particles. The silver-coated particles in the resultant ethanol dispersed solution were washed with ethanol, and were additionally dried, thereby obtaining a dried powder of the silver-coated particles to which the functional group was introduced.

Here, measurement of the Young's modulus of the silver-coated particles was performed as follows.

A loading-unloading test was performed in a state in which the maximum load was set to 60% of fracture strength of particles by using a microcompression tester (for example, "MCT-2000" manufactured by Shimadzu Corporation), thereby obtaining a load-displacement curve. The load in the load-displacement curve was converted into compressive strength by using the following Expression.

Compressive strength=2.8×load/(π×particle size×particle size)

In addition, the displacement was divided by the particle size to be converted into distortion, thereby obtaining a compressive strength-displacement curve. In the compressive strength-displacement curve, an inclination in a linear region ranging from the maximum load value (60% of the fracture strength) to 55% of the fracture strength in an unloading curve was set as a value of the Young's modulus. With regard to the Young's modulus obtained as described above, an average value of 20 particles was calculated, and was set as the Young's modulus of the silver-coated particles. Measurement results are illustrated in Table 2.

Next, a binder resin and a blending agent (curing agent) illustrated in Table 1 were mixed by using AWATORI RENTARO (manufactured by THINKY) while performing dilution with a solvent illustrated in Table 1, thereby obtaining a binder mixed solution.

Here, measurement of the Young's modulus of the binder resin after being cured was performed as follows by using the obtained binder mixed solution.

First, the binder mixed solution was applied onto a stainless steel (SUS) substrate, and an obtained coated film was heated under conditions of a temperature of 180° C. for one hour, thereby forming a resin film on the SUS substrate. Then, the Young's modulus of the obtained resin film (binder resin after being cured) was measured as follows.

A loading-unloading test was performed in a state in which the maximum load was set to 30 mgf under an environment of 25° C. by using a microindentation hardness tester (for example, "ENT-1100" manufactured by ELIONIX INC.), thereby obtaining a load-displacement curve. An intersection between a straight line obtained by approximating a curve from initiation of unloading to 15 mgf in the unloading curve by using a least square method, and the horizontal axis of the load-displacement curve was set as h1 [μm], and a value of the maximum displacement [μm]−h1 [μm] was set as h2 [μm]. In this state, the Young's modulus was obtained from the following Expression.

Young's modulus $E$[GPa]=0.0532/($h1 \times h2$)

With regard to the Young's modulus obtained as described above, an average value of values measured at 20 sites on the resin film was set as the Young's modulus of the binder resin. Measurement results are illustrated in Table 2.

Next, the silver-coated particles and the binder mixed solution prepared in the previous processes were weighed in such a manner that a volume ratio between the silver-coated particles and the binder resin in the resin composition after being cured became a ratio of 1:1, and the resultant mixture was mixed by using AWATORI RENTARO (manufactured by THINKY). The resultant mixture was kneaded by using a three-roll mill, and a solvent illustrated in Table 1 was additionally added to the mixture, thereby adjusting viscosity of the resin composition as illustrated in Table 2. As the viscosity, the viscosity measured with a rheometer (DHR3 manufactured by TA Instruments) at a rotary speed of 1 rpm by using a planar plate of 20 mm was used.

Example 2

First, so as to prepare the silver-coated particles, 15 g of stannous chloride and 15 cm$^3$ of 35% hydrochloric acid were diluted (diluted in measuring cylinder) to 1 dm$^3$ with water by using a measuring flask having a capacity of 1 dm$^3$, and the resultant aqueous solution was kept at a temperature of 25° C. 50 g of acrylic resin particles having an average particle size of 35 μm and a particle size a coefficient of variation of 2.1% was added to the aqueous solution, and the resultant mixture was stirred for one hour. Then, the resin particles were filtrated and were washed with water. Accordingly, a tin-adsorbed layer was provided on the surface of the resin particles.

Next, 10.7 g of tetrasodium ethylenediaminetetraacetate (complexing agent), 2.5 g of sodium hydroxide, and 5 cm$^3$ of formalin (reducing agent) were dissolved in 2 dm$^3$ of water to prepare an aqueous solution including the complexing agent and the reducing agent. In addition, 1.7 g of silver nitrate, 2 cm$^3$ of 25% ammonia water, and 10 cm$^3$ of water were mixed with each other to prepare an aqueous solution including silver nitrate.

Next, the resin particles provided with the tin-adsorbed layer were immersed in the aqueous solution including the complexing agent and the reducing agent.

Then, the aqueous solution including silver nitrate was added dropwise to the above-described aqueous solution while stirring the aqueous solution to coat the resin particles, provided with the tin-adsorbed layer, with silver so that a ratio of silver in the silver-coated particles obtained became 2 mass %, thereby preparing the silver-coated particles. Then, the silver-coated particles were washed with water, and were dried.

Next, 50 g of the silver-coated particles was subjected to surface washing with an alkali washing solution, and then vacuum drying was performed. Then, 10 g a surface-treating agent illustrated in Table 1 was added to the dried silver-coated particles, and the resultant mixture was kneaded, thereby introducing a functional group illustrated in Table 1 to the surface of the silver-coated particles.

A resin composition was prepared in the same manner as in Example 1 except that the silver-coated particles prepared as described above were used.

Examples 3 to 10, and Comparative Example 1

In Examples 3 to 10, and Comparative Example 1, silver-coated particles in which a ratio of silver in the silver-coated particles was set to an amount illustrated in Table 1 were prepared by using parent particles of the silver-coated particles as illustrated in Table 1. A resin composition was prepared in the same manner as in Example 1 except that the prepared silver-coated particles were used.

<Reliability Test>

A reliability test was performed with respect to the prepared resin composition. Specifically, first, the prepared resin composition was applied to two sheets of aluminum substrate at a thickness of 100 μm, and was heated at a temperature of 150° C. for 1 hour to cure the resin composition. Accordingly, the aluminum substrates were bonded to each other, and this bonded body was set as a test specimen. Next, the test specimen was subjected to a heat cycle test for 1000 cycles in a range of −45° C. to 125° C. by using a heat cycle tester ("TSD-100", manufactured by ESPEC CORP.). After the heat cycle test, a bonding rate was evaluated with respect to the test specimen.

Furthermore, the bonding rate evaluation was performed as follows. A test specimen bonding interface before and after the heat cycle test was observed by using an ultrasonic flaw detection image, and a bonding area and a peeling-off area were measured through image analysis to obtain an initial bonding rate (a bonding rate before the heat cycle test) and a bonding rate after the heat cycle (a bonding rate after the heat cycle test). The initial bonding rate and the bonding rate after the heat cycle (unit: %) were obtained by the following Expression.

Initial bonding rate=bonding area before heat cycle test/(bonding area before heat cycle test+peeling-off area before heat cycle test)×100

Bonding rate after heat cycle=(bonding area before heat cycle test−peeling-off area after heat cycle test)/bonding area before heat cycle test×100

TABLE 1

| | | Silver-coated particles | | | | | |
|---|---|---|---|---|---|---|---|
| | Parent particles | Silver ratio [mass %] | Average particle size [μm] | Introduced functional group | Surface-treating agent (Material name) | Binder resin (Company name Product name) | Blending agent (Curing agent) (Company name Product name) | Solvent (Material name) |
| Examples | 1 Acrylic resin particles | 50 | 10.8 | Epoxy group | 3-Glycidoxypropyl-trimethoxysilane | Novolac epoxy resin (Nippon Kayaku Co., Ltd. EPPN-502H) | Dicyandiamide (ADEKA HARDENER EH-4351S) Silicon oil (Dow Corning Toray Co., Ltd. SF8421 EG) | n-Ethylene glycol monobutyl ether acetate |
| | 2 Acrylic resin particles | 2 | 35.1 | Epoxy group | 3-Glycidoxypropyl-trimethoxysilane | Bisphenol F type epoxy resin (Nippon Kayaku Co., Ltd. RE-303SL) Rubber-modified epoxy resin (ADEKA EPR-4030) | Dicyandiamide (Mitsubishi Chemical Corporation DICY7) | n-Ethylene glycol monobutyl ether |
| | 3 Silicone resin particles | 40 | 15.4 | Carboxyl group | Oleic acid | Silicone resin (ThreeBond Co., Ltd. TB1530) | (Blended) | Mineral spirit |
| | 4 Highly crossed-linked acrylic resin particles | 81 | 2.2 | Imino group | Polyethyleneimine | Biphenyl type epoxy (Nippon Kayaku Co., Ltd. NC-3000) | Phenol-based curing agent (Mitsubishi Chemical Corporation jER170) | n-Ethylene glycol monobutyl ether |
| | 5 Highly cross-linked acrylic resin particles | 73 | 3.4 | Mercapto group | 3-Mercaptopropylmethyl-dimethoxysilane | Rubber-modified epoxy resin (ADEKA EPR-4030) | Dicyandiamide (Mitsubishi Chemical Corporation DICY7) | n-Ethylene glycol monobutyl ether |
| | 6 Silicone rubber particles | 20 | 30.3 | Carboxyl group | Stearic acid | Urethane resin (MATSUI SHIKISO CHEMICAL Co., Ltd. AR binder GS) | (Curing agent is unnecessary) | n-Ethylene glycol monobutyl ether |
| | 7 Silicone resin particles | 42 | 11.4 | Amino group | 2-Ethylhexylamine | Polyimide resin (Hitachi Chemical Co., Ltd. HI-406D) | (Curing agent is unnecessary) | N-Methyl-2-pyrrolidone |
| | 8 Styrene resin particles | 65 | 4.5 | Mercapto group | 1,4-bis(3-mercapto-butyryloxy) butane | Novolac epoxy resin (Nippon Kayaku Co., Ltd. EPPN-502H) | Dicyandiamide (Mitsubishi Chemical Corporation DICY7) Silicon oil (Dow Corning Toray Co., Ltd. SF8421 EG) | n-Ethylene glycol monobutyl ether acetate |
| | 9 Phenol resin particles | 52 | 9.5 | Carbonyl group | Urea | Multifunctional epoxy resin (ADEKA EP-3950S) | Dicyandiamide (ADEKA HARDENER EH-4351S) (Blended) | n-Ethylene glycol monoethyl ether |
| | 10 Silicone resin particles | 45 | 11.5 | Imidazole group | 4-Methylimidazole | Epoxy resin (CEMEDINE Co., Ltd. EP170) | | n-Ethylene glycol monobutyl ether |
| Comparative Examples | 1 Highly cross-linked acrylic resin-particles | 86 | 1.7 | Epoxy group | 3-Glycidoxypropyl-trimethoxysilane | Bis A Epoxy (Mitsubishi Chemical Corporation jER828) | Phenol-based curing agent (Mitsubishi Chemical Corporation jER170) | n-Ethylene glycol monobutyl ether |
| | 2 Hollow acrylic resin | 70 | 2.3 | Epoxy group | 3-Glycidoxypropyl-trimethoxysilane | Bis A epoxy (Mitsubishi Chemical Corporation jER828) | Phenol-based curing agent (Mitsubishi Chemical Corporation jER170) | n-Ethylene glycol monobutyl ether |
| | 3 Silicone rubber particles | 10 | 40.3 | Amino group | Hexamethylenediamine | Condensation type silicone (Dow Corning Toray Co., Ltd. SE1714) | (Blended) | Mineral spirit |
| | 4 Silicone resin particles | 30 | 20.4 | Mercapto group | Dodecanethiol | Urethane resin (TOSOH CORPORATION NIPPOLAN 5199) | (Curing agent is unnecessary) | Toluene, Mineral spirit |
| | 5 Acrylic resin particles | 89 | 1.3 | — | — | Bis F epoxy (Mitsubishi Chemical Corporation jER806) | Phenol-based curing agent (Nippon Kayaku Co., Ltd. GPC-65) | n-Ethylene glycol monobutyl ether |

TABLE 2

|  |  | Young's modulus Silver-coated particles a[GPa] | Young's modulus Binder resin b[GPa] | Ratio a/b | Composition viscosity Pa·s | Initial bonding rate [%] | Bonding rate after heat cycle [%] |
|---|---|---|---|---|---|---|---|
| Examples | 1 | 1.20 | 1.10 | 1.09 | 39 | 93 | 92 |
|  | 2 | 0.95 | 0.85 | 1.12 | 42 | 92 | 91 |
|  | 3 | 0.50 | 0.25 | 2.00 | 38 | 92 | 70 |
|  | 4 | 2.00 | 5.00 | 0.40 | 3 | 91 | 65 |
|  | 5 | 1.90 | 1.20 | 1.58 | 43 | 92 | 87 |
|  | 6 | 0.05 | 0.49 | 0.10 | 50 | 88 | 70 |
|  | 7 | 0.55 | 2.80 | 0.20 | 22 | 87 | 66 |
|  | 8 | 1.55 | 1.10 | 1.41 | 35 | 90 | 81 |
|  | 9 | 1.90 | 3.10 | 0.61 | 28 | 88 | 71 |
|  | 10 | 0.45 | 0.70 | 0.64 | 55 | 89 | 73 |
| Comparative Examples | 1 | 2.20 | 2.00 | 1.10 | 42 | 91 | 54 |
|  | 2 | 0.15 | 2.00 | 0.08 | 35 | 93 | 52 |
|  | 3 | 0.03 | 0.05 | 0.60 | 48 | 79 | 42 |
|  | 4 | 0.30 | 0.12 | 2.50 | 10 | 69 | 25 |
|  | 5 | 3.50 | 1.90 | 1.84 | 37 | 89 | 58 |

In Comparative Examples 1 and 3 in which the Young's modulus (a) of the silver-coated particles was out of the range of the invention, Comparative Examples 2 and 4 in which the ratio (a/b) of the Young's modulus (a) of the silver-coated particles to the Young's modulus (b) of the binder resin after being cured was out of the range of the invention, and Comparative example 5 in which the functional group was not introduced to the surface of the silver-coated particles, the bonding rate after heat cycle greatly decreased.

In contrast, in Examples 1 to 10 in which the functional group was introduced to the surface of the silver-coated particles, and the Young's modulus (a) of the silver-coated particles and the ratio (a/b) of the Young's modulus (a) of the silver-coated particles to the Young's modulus (b) of the binder resin after being cured were in the range of the invention, it was confirmed that the bonding rate after heat cycle further increased in comparison to Comparative Examples.

INDUSTRIAL APPLICABILITY

The resin composition of the invention can form an adhesive layer in which a local concentration of thermal stress is mitigated, and can be used, for example, when a semiconductor element is mounted on an insulating circuit substrate and the like.

REFERENCE SIGNS LIST

1: Power module
3: Semiconductor element
10: Power module substrate
12: Circuit layer
30: Conductive bonding layer

The invention claimed is:

1. A resin composition, comprising:
a binder resin; and
silver-coated particles in which a functional group is introduced to a surface,
wherein a ratio (a/b) of Young's modulus (a) of the silver-coated particles to Young's modulus (b) of the binder resin after being cured is 0.1 to 2.0, and
the Young's modulus (a) of the silver-coated particles is 0.05 to 2.0 GPa.

2. The resin composition according to claim 1,
wherein the ratio (a/b) of the Young's modulus (a) of the silver-coated particles to the Young's modulus (b) of the binder resin after being cured is 0.4 to 2.0, and
the Young's modulus (a) of the silver-coated particles is 0.2 to 2.0 GPa.

3. The resin composition according to claim 1,
wherein the functional group is selected from the group consisting of an epoxy group, a carboxyl group, a carbonyl group, an amino group, an amide group, an imino group, an imidazole group, and a mercapto group.

4. A bonded body, comprising:
a first member and a second member bonded to each other,
wherein the resin composition according to claim 1 is interposed between the first member and the second member.

5. A semiconductor device, comprising:
an insulating circuit substrate in which a circuit layer is disposed on one surface of an insulating layer; and
a semiconductor element bonded to a surface of the circuit layer, said surface being opposite the insulating layer,
wherein the resin composition according to claim 1 is interposed between the circuit layer and the semiconductor element.

6. The resin composition according to claim 2,
wherein the functional group is selected from the group consisting of an epoxy group, a carboxyl group, a carbonyl group, an amino group, an amide group, an imino group, an imidazole group, and a mercapto group.

7. A bonded body, comprising:
a first member and a second member bonded to each other,
wherein the resin composition according to claim 2 is interposed between the first member and the second member.

8. A bonded body, comprising:
a first member and a second member bonded to each other,
wherein the resin composition according to claim 3 is interposed between the first member and the second member.

9. A bonded body, comprising:
a first member and a second member bonded to each other,
wherein the resin composition according to claim 6 is interposed between the first member and the second member.

10. A semiconductor device, comprising:
an insulating circuit substrate in which a circuit layer is disposed on one surface of an insulating layer; and
a semiconductor element bonded to a surface of the circuit layer, said surface being opposite the insulating layer,
wherein the resin composition according to claim 2 is interposed between the circuit layer and the semiconductor element.

11. A semiconductor device, comprising:
an insulating circuit substrate in which a circuit layer is disposed on one surface of an insulating layer; and
a semiconductor element bonded to a surface of the circuit layer, said surface being opposite the insulating layer,
wherein the resin composition according to claim 3 is interposed between the circuit layer and the semiconductor element.

12. A semiconductor device, comprising:
an insulating circuit substrate in which a circuit layer is disposed on one surface of an insulating layer; and
a semiconductor element bonded to a surface of the circuit layer, said surface being opposite the insulating layer,
wherein the resin composition according to claim 6 is interposed between the circuit layer and the semiconductor element.

* * * * *